(12) United States Patent
Shi

(10) Patent No.: US 11,004,937 B1
(45) Date of Patent: May 11, 2021

(54) SEMICONDUCTOR DEVICE AND MANUFACTURING METHOD THEREOF

(71) Applicant: UNITED MICROELECTRONICS CORP., Hsin-Chu (TW)

(72) Inventor: Jian Shi, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/733,223

(22) Filed: Jan. 2, 2020

(30) Foreign Application Priority Data

Dec. 2, 2019 (CN) .......................... 201911211808.3

(51) Int. Cl.

| | |
|---|---|
| *H01L 29/10* | (2006.01) |
| *H01L 27/12* | (2006.01) |
| *H01L 29/06* | (2006.01) |
| *H01L 29/08* | (2006.01) |
| *H01L 23/528* | (2006.01) |
| *H01L 21/768* | (2006.01) |
| *H01L 21/311* | (2006.01) |
| *H01L 21/84* | (2006.01) |
| *H01L 21/321* | (2006.01) |

(52) U.S. Cl.
CPC .... *H01L 29/1087* (2013.01); *H01L 21/31111* (2013.01); *H01L 21/7684* (2013.01); *H01L 21/76802* (2013.01); *H01L 21/76877* (2013.01); *H01L 21/76898* (2013.01); *H01L 21/84* (2013.01); *H01L 23/528* (2013.01); *H01L 27/1203* (2013.01); *H01L 29/0649* (2013.01); *H01L 29/0847* (2013.01); *H01L 21/3212* (2013.01)

(58) Field of Classification Search
CPC .......... H01L 29/1087; H01L 21/31111; H01L 21/76802; H01L 21/7684; H01L 21/76877; H01L 21/76898; H01L 21/84; H01L 23/528
USPC .................. 257/347, 349, 288; 438/149, 153
See application file for complete search history.

(56) References Cited

U.S. PATENT DOCUMENTS

| | | | |
|---|---|---|---|
| 6,372,562 B1 | 4/2002 | Matsumoto | |
| 8,921,976 B2 | 12/2014 | Zhang | |
| 2004/0121599 A1 | 6/2004 | Aminpur | |
| 2005/0176184 A1 | 8/2005 | Okihara | |
| 2007/0296002 A1* | 12/2007 | Liang et al. | ............ H01L 21/84 257/347 |

* cited by examiner

*Primary Examiner* — Thinh T Nguyen
(74) *Attorney, Agent, or Firm* — Winston Hsu

(57) ABSTRACT

A semiconductor device includes a substrate, a gate structure, a source/drain region, a contact opening, an etching stop layer, an interlayer dielectric layer, and a first contact structure. The substrate includes a buried insulation layer, a semiconductor layer, and an isolation structure. The semiconductor layer is disposed on the buried insulation layer. The gate structure is disposed on the semiconductor layer. The isolation structure and the source/drain region are disposed in the semiconductor layer. The contact opening penetrates at least a part of the substrate. The etching stop layer is disposed on the gate structure, the source/drain region, a sidewall of the contact opening, and a bottom of the contact opening. The interlayer dielectric layer is disposed on the etching stop layer. The first contact structure penetrates the interlayer dielectric layer and the etching stop layer in the contact opening.

20 Claims, 17 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device including an etching stop layer and a manufacturing method thereof.

2. Description of the Prior Art

In integrated circuit structures, contact structures are formed in a dielectric material covering semiconductor units for being electrically connected to each parts of the semiconductor units. However, as the structure of the circuits becomes complicated, contact structures corresponding to different parts and/or having different uses may have to pass through different material layers and/or have different depths, which complicates the process of forming the contact structure and influences the manufacturing yield. Accordingly, the related structural design and/or process approaches still have to be modified for achieving the effect of process simplification and manufacturing yield enhancement.

SUMMARY OF THE INVENTION

It is one of the objectives of the present invention to provide a semiconductor device and a manufacturing method thereof. An etching stop layer is formed in a contact opening penetrating at least a part of a substrate for integrating manufacturing steps of different contact structures. The purposes of process simplification and manufacturing yield enhancement may be achieved accordingly.

A semiconductor device is provided in an embodiment of the present invention. The semiconductor device includes a substrate, a gate structure, a source/drain region, a contact opening, an etching stop layer, an interlayer dielectric layer, and a first contact structure. The substrate includes a buried insulation layer, a semiconductor layer, and an isolation structure. The semiconductor layer is disposed on the buried insulation layer. The isolation structure is disposed in the semiconductor layer. The gate structure is disposed on the semiconductor layer. The source/drain region is disposed in the semiconductor layer. The contact opening penetrates at least a part of the substrate, and at least a part of the contact opening is disposed above the buried insulation layer. The etching stop layer is disposed on the gate structure, the source/drain region, a sidewall of the contact opening, and a bottom of the contact opening. The interlayer dielectric layer is disposed on the etching stop layer, and the interlayer dielectric layer is partially disposed in the contact opening. The first contact structure penetrates the interlayer dielectric layer in the contact opening and the etching stop layer in the contact opening.

A manufacturing method of a semiconductor device is provided in an embodiment of the present invention. The manufacturing method includes the following steps. Firstly, a substrate is provided. The substrate includes a buried insulation layer, a semiconductor layer, and an isolation structure. The semiconductor layer is disposed on the buried insulation layer, and the isolation structure is disposed in the semiconductor layer. A gate structure is formed on the semiconductor layer. A source/drain region is formed in the semiconductor layer. A contact opening is formed penetrating at least a part of the substrate, and at least a part of the contact opening is formed above the buried insulation layer. An etching stop layer is formed on the gate structure, the source/drain region, a sidewall of the contact opening, and a bottom of the contact opening. An interlayer dielectric layer is formed on the etching stop layer, and the interlayer dielectric layer is partially formed in the contact opening. A first contact structure is formed penetrating the interlayer dielectric layer in the contact opening and the etching stop layer in the contact opening.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-10 are schematic drawings illustrating a manufacturing method of a semiconductor device according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, and FIG. 10 is a schematic drawing in a step subsequent to FIG. 9.

FIGS. 11-14 are schematic drawings illustrating a manufacturing method of a semiconductor device according to a second embodiment of the present invention, wherein FIG. 12 is a schematic drawing in a step subsequent to FIG. 11, FIG. 13 is a schematic drawing in a step subsequent to FIG. 12, and FIG. 14 is a schematic drawing in a step subsequent to FIG. 13.

FIGS. 15-17 are schematic drawings illustrating a manufacturing method of a semiconductor device according to a third embodiment of the present invention, wherein FIG. 16 is a schematic drawing in a step subsequent to FIG. 15, and FIG. 17 is a schematic drawing in a step subsequent to FIG. 16.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Additionally, terms, such as "bottom", "below", "above", "top", and the like, may be used herein for ease of description to describe one element or feature's relationship to another element(s) or feature(s) as illustrated in the figures. If the device in the figures in turned over, elements described as "above" can become "below". It will be understood that spatially relative terms are intended to encompass different orientations of the device in use or operation in addition to the orientations depicted in the figures.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
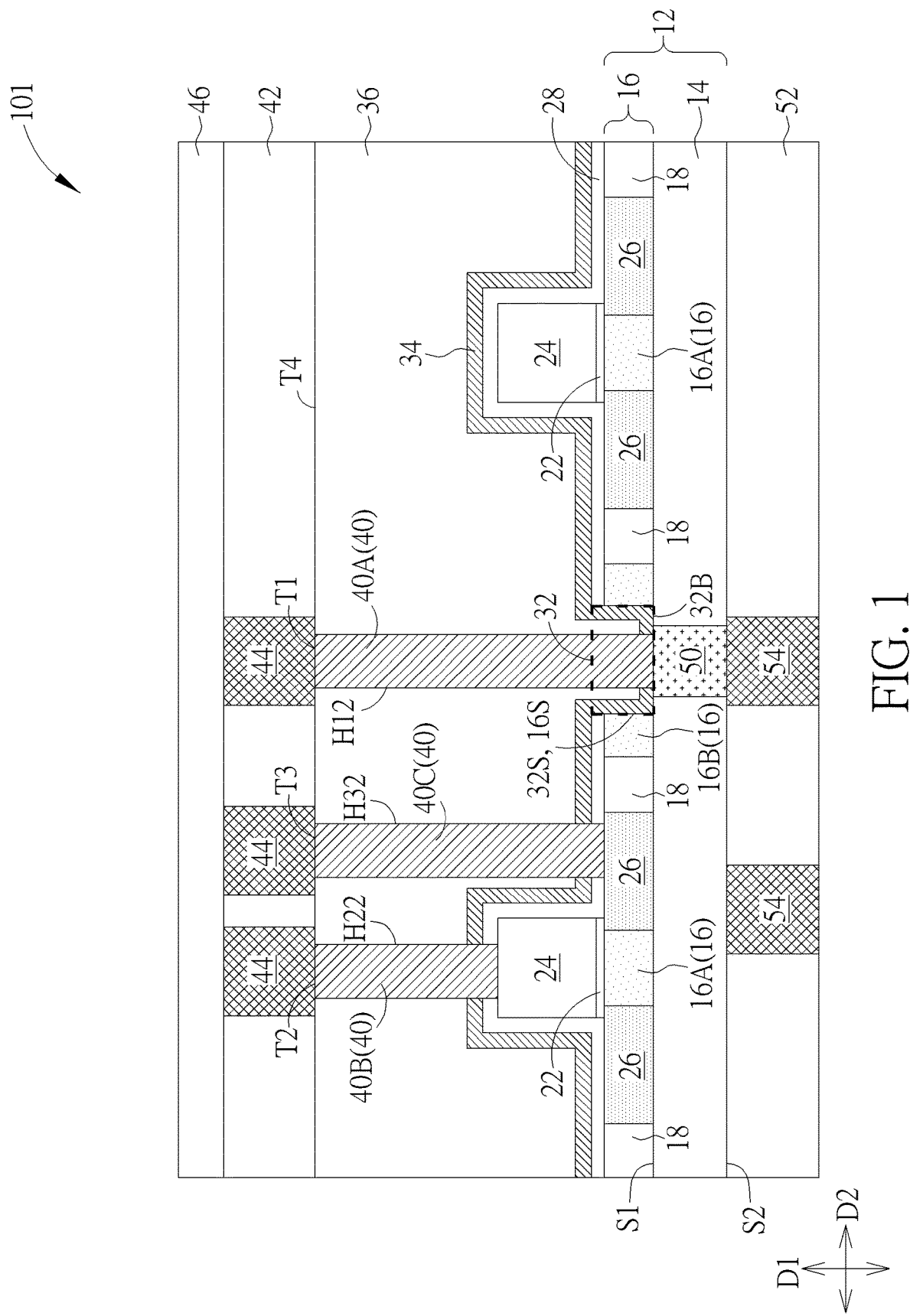
FIG. 1 is a schematic drawing illustrating a semiconductor device according to a first embodiment of the present invention.

Please refer to FIG. 1. FIG. 1 is a schematic drawing illustrating a semiconductor device according to a first embodiment of the present invention. As shown in FIG. 1, a semiconductor device 101 is provided in this embodiment. The semiconductor device 101 includes a substrate 12, a gate structure 24, a source/drain region 26, a contact opening 32, an etching stop layer 34, an interlayer dielectric layer 36, and a first contact structure 40A. The substrate 12 includes a buried insulation layer 14, a semiconductor layer 16, and an isolation structure 18. The semiconductor layer 16 is disposed on the buried insulation layer 14. The isolation structure 18 is disposed in the semiconductor layer 16. The gate structure 24 is disposed on the semiconductor layer 16. The source/drain region 26 is disposed in the semiconductor layer 16. The contact opening 32 penetrates at least a part of the substrate 12, and at least a part of the contact opening 32 is disposed above the buried insulation layer 14. The etching stop layer 34 is disposed on the gate structure 24, the source/drain region 26, a sidewall 32S of the contact opening 32, and a bottom 32B of the contact opening 32. The interlayer dielectric layer 36 is disposed on the etching stop layer 34, and the interlayer dielectric layer 36 is partially disposed in the contact opening 32. The first contact structure 40A penetrates the interlayer dielectric layer 36 in the contact opening 32 and the etching stop layer 34 in the contact opening 32.

In some embodiments, the substrate 12 may be regarded as a part of a semiconductor-on-insulator (SOI) substrate and include the buried insulation layer 14 and the semiconductor layer 16 described above, but not limited thereto. For example, when the substrate 12 is a part of a SOI substrate, the buried insulation layer 14 and the semiconductor layer 16 may be the insulation layer and the semiconductor layer in the SOI substrate. The buried insulation layer 14 may include a buried oxide insulation layer, and the semiconductor layer 16 may include a silicon-containing semiconductor layer, but not limited thereto. In some embodiments, the buried insulation layer 14 may also be formed by other insulation materials according to some considerations and/or the semiconductor layer 16 may also be formed by other semiconductor materials according to some considerations. The buried insulation layer 14 may have a first side S1 and a second side S2 opposite to the first side S1 in a thickness direction of the buried insulation layer 14 (such as a first direction D1 shown in FIG. 1). When the buried insulation layer 14 and the semiconductor layer 16 are the insulation layer and the semiconductor layer in the SOI substrate, the first side S1 of the buried insulation layer 14 may be regarded as a front side, the second side S2 of the buried insulation layer 14 may be regarded as a back side, and the semiconductor layer 16 may be disposed at the first side S1 of the buried insulation layer 14, but not limited thereto.

In some embodiments, the isolation structure 18 disposed in the semiconductor layer 16 may be used to isolating different regions in the semiconductor layer 16 from one another, such as a first portion 16A and a second portion 16B shown in FIG. 1, and the isolation structure 18 may include a single layer or multiple layers of insulation materials, such as an oxide insulation material and an oxynitride insulation material, but not limited thereto. In some embodiments, the semiconductor device 101 may include a plurality of the gate structures 24, a plurality of the source/drain regions 26, and a plurality of gate dielectric layers 22. Each of the gate structures 24 may be disposed on the semiconductor layer 16 and located at the first side S1 of the buried insulation layer 14. A part of the semiconductor layer 16 (such as the first portion 16A) may be located between the buried insulation layer 14 and each of the gate structures 24 in the first direction D1, and the gate dielectric layer 22 may be located between the corresponding gate structure 24 and the semiconductor layer 16 in the first direction D1. In some embodiments, two of the source/drain regions 26 may be disposed in the semiconductor layer 16 and located at two opposite sides of the corresponding gate structure 24 in a horizontal direction (such as a second direction D2 shown in FIG. 1), and the first portion 16A of the semiconductor layer 16 located between the two source/drain regions 26 may be regarded as a channel region and/or a body region, but not limited thereto.

In some embodiments, the gate structure 24 may include a non-metallic gate electrode, such as a polysilicon gate electrode, a non-metallic gate electrode formed by other suitable conductive materials, or a metal gate electrode formed by other suitable conductive materials, and the gate dielectric layer 22 may include an oxide layer, such as a silicon oxide layer, or other suitable dielectric materials, such as high dielectric constant (high-k) dielectric materials. In some embodiments, the source/drain region 26 may include a doped region, such as a doped region include n-type dopants (such as phosphorous and/or arsenic), and the body region described above may include a well, such as a p-well, but not limited thereto. In some embodiments, the source/drain region 26 may also be formed by other kinds of n-type dopants or dopants with other conductivity types according to some considerations.

In some embodiments, the gate structure 24, the gate dielectric layer 22, the source/drain regions 26, and the first portion 16A of the semiconductor layer 16 may constitute a semiconductor unit (such as a transistor), and the second portion 16B of the semiconductor layer 16 may be located between adjacent semiconductor units and may be electrically isolated from the first portion 16A of the semiconductor layer 16 by the isolation structure 18, but not limited thereto In some embodiments, the semiconductor device 101 may further include a conductive structure 54 disposed on the buried insulation layer 14 and located at the second side S2 of the buried insulation layer 14, and the first contact structure 40A is electrically connected with the conductive structure 54. In some embodiments, the contact opening 32 may penetrate the semiconductor layer 16 (such as the second portion 16B of the semiconductor layer 16) in the first direction D1, and the contact opening 32 may be disposed at the first side S1 of the buried insulation layer 14 accordingly. The etching stop layer 34 disposed in the contact opening 32 may directly contact a sidewall 16S of the semiconductor layer 16. In some embodiments, the semiconductor device 101 may further include a connection structure 50 disposed in the buried insulation layer 14 and located between the first contact structure 40A and the conductive structure 54, and the first contact structure 40A may be electrically connected with the conductive structure 54 via the connection structure 50. The first contact structure 40A, the connection structure 50, and the conductive structure 54 described above may be regarded as a back side connection structure in the semiconductor device 101, but not limited thereto. Additionally, in some embodiments, the semiconductor device 101 may further include a dielectric layer 52 disposed at the second side S2 of the buried insulation layer 14, and the conductive structure 54 may be disposed in the dielectric layer 52, but not limited thereto.

In some embodiments, the semiconductor device 101 may further include a second contact structure 40B and a third contact structure 40C. The second contact structure 40B may penetrate the interlayer dielectric layer 36 and the etching stop layer 34 on the gate structure 24 in the first direction D1, and the second contact structure 40B is electrically connected with the gate structure 24. The third contact structure 40C may penetrate the interlayer dielectric layer 36 and the etching stop layer 34 on the source/drain region 26 in the first direction D1, and the third contact structure 40C is electrically connected with the source/drain region 26. In some embodiments, a top surface T1 of the first contact structure 40A, a top surface T2 of the second contact structure 40B, and a top surface T3 of the third contact structure 40C may be coplanar with one another, but not limited thereto.

In some embodiments, the semiconductor device 101 may further include a dielectric layer 42 and an interconnection structure 44. The dielectric layer 42 and the interconnection structure 44 may be disposed on the interlayer dielectric layer 36, and the interconnection structure 44 may be disposed in the dielectric layer 42. The interconnection structure 44 may be electrically connected with the first contact structure 40A, the second contact structure 40B, and the third contact structure 40C respectively, but not limited thereto. In some embodiments, the conductive structure 54 located at the back side of the semiconductor device 101 (such as the second side S2 of the buried insulation layer 14) may be electrically connected with the second contact structure 40B and/or the third contact structure 40C via the connection structure 50, the first contact structure 40A, and the interconnection structure 44, and electrically conductive paths connected to the semiconductor units may be formed from the back side of the semiconductor device 101 accordingly, but not limited thereto. Additionally, the semiconductor device 101 may be regarded as a radiofrequency switch device or a semiconductor device of other suitable configurations and/or having other functions.

It is worth noting that, the second contact structure 40B and the third contact structure 40C corresponding to the semiconductor unit and the first contact structure 40A corresponding to the back side connection structure may be formed concurrently by the same process because the contact opening 32 corresponding to the back side connection structure is formed in the substrate 12 first and the etching stop layer 34 is formed in the contact opening 32 and formed on the semiconductor unit. The purposes of process simplification and manufacturing yield enhancement may be achieved accordingly.

In some embodiments, the semiconductor device 101 may further include a first protection layer 28 and a second protection layer 46. The first protection layer 28 may be disposed between the semiconductor layer 16 and the etching stop layer 34, and the second protection layer 46 may cover the dielectric layer 42 and the interconnection structure 44 for providing a protection effect to the interconnection structure 44, but not limited thereto. In some embodiments, the first protection layer 28 may not be disposed in the contact opening 32, the second contact structure 40B may penetrate the interlayer dielectric layer 36, the etching stop layer 34, and the first protection layer 28 on the gate structure 24 in the first direction D1 for contacting the gate structure 24 and being electrically connected with the gate structure 24, and the third contact structure 40C may penetrate the interlayer dielectric layer 36, the etching stop layer 34, and the first protection layer 28 on the source/drain region 26 for contacting the source/drain region 26 and being electrically connected with the source/drain region 26, but not limited thereto. In some embodiments, a silicide layer (such as a metal silicide layer, not shown) may be disposed between the second contact structure 40B and the gate structure 24 and/or disposed between the third contact structure 40C and the source/drain region 26 according to design considerations for reducing the electrical contact resistance between the second contact structure 40B and the gate structure 24 and/or the electrical contact resistance between the third contact structure 40C and the source/drain region 26.

In some embodiments, the first contact structure 40A, the second contact structure 40B, the third contact structure 40C, the interconnection structure 44, the connection structure 50, and the conductive structure 54 described above may include a conductive material and a barrier layer surrounding this conductive material respectively. The conductive material mentioned above may include a conductive material having relatively lower electrical resistivity, such as copper, aluminum, and tungsten, and the barrier layer mentioned above may include titanium nitride, tantalum nitride, or other suitable electrically conductive barrier materials, but not limited thereto. In some embodiments, the interlayer dielectric layer 36, the dielectric layer 42, the dielectric layer 52, and the second protection layer 46 may respectively include a single layer or multiple layers of dielectric materials, such as silicon oxide, silicon oxynitride, low dielectric constant (low-k) materials, or other suitable dielectric materials. In addition, the etching stop layer 34 may include nitride (such as silicon nitride) or other suitable dielectric materials different from the material of the interlayer dielectric layer 36 and having required etching selectivity with the material of the interlayer dielectric layer 36. In some embodiments, the first protection layer 28 may include nitride (such as silicon nitride), oxynitride, or other suitable dielectric materials. It is worth noting that, in some embodiments, the material composition of the etching stop layer 34 and the material composition of the first protection layer 28 may be different from the material composition of the interlayer dielectric layer 36, and the material composition of the first protection layer 28 may be identical to the material composition of the etching stop layer 34 for providing the required etching selectivity during the manufacturing processes, but not limited thereto. In some embodiments, the first protection layer 28 may not be disposed in the semiconductor device, and the etching stop layer 34 may directly contact the gate structure 24, the source/drain region 26, the semiconductor layer 16, and the isolation structure 18 according to some design considerations.

Figure 2:
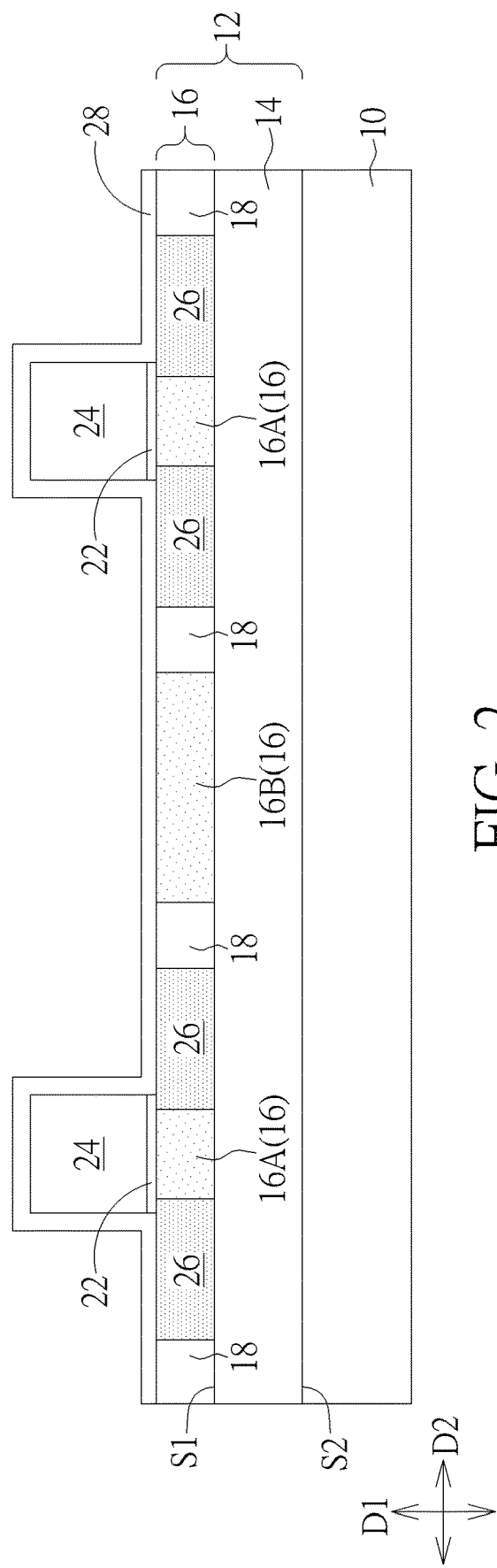
Figure 3:
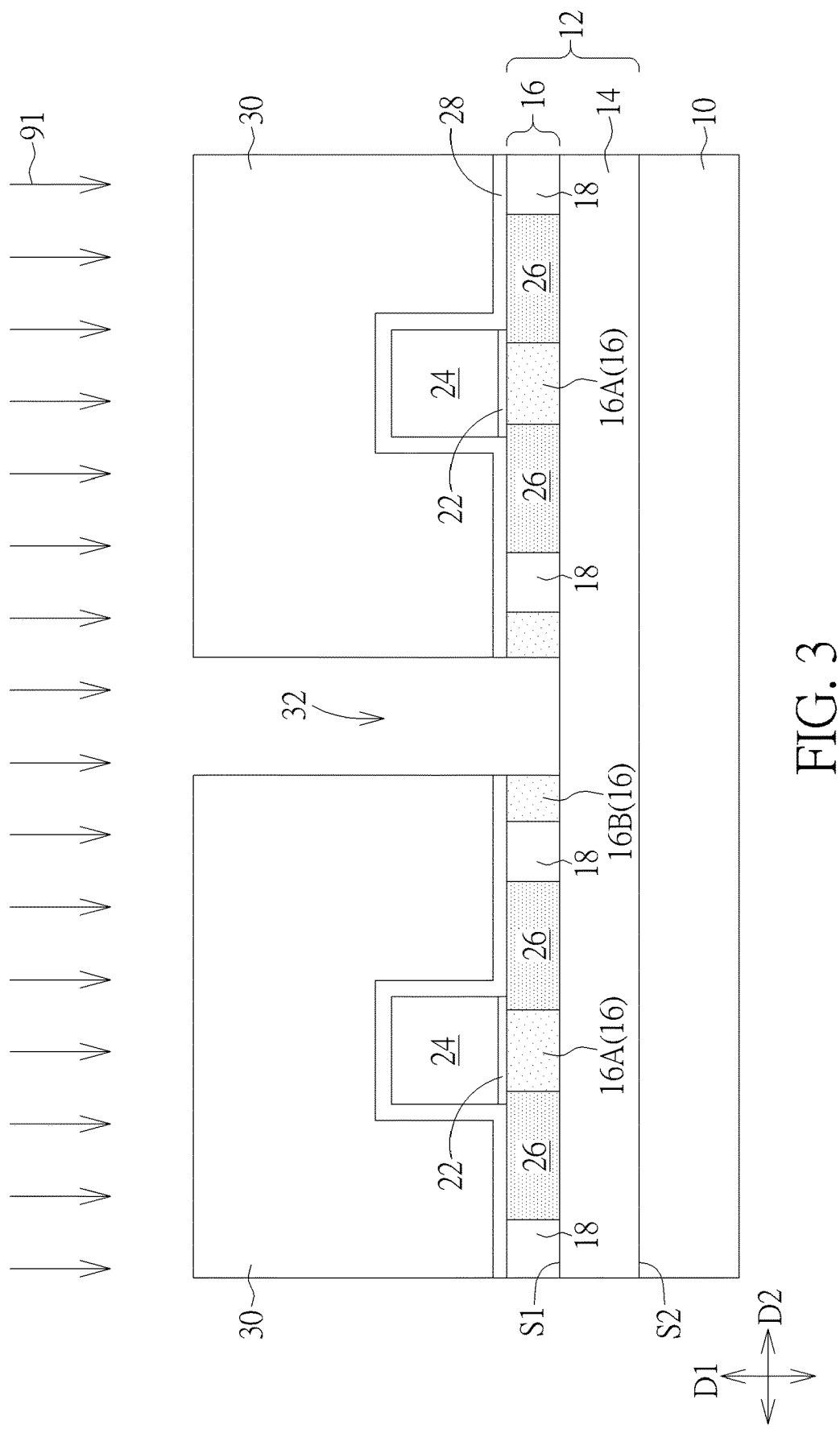
Figure 4:
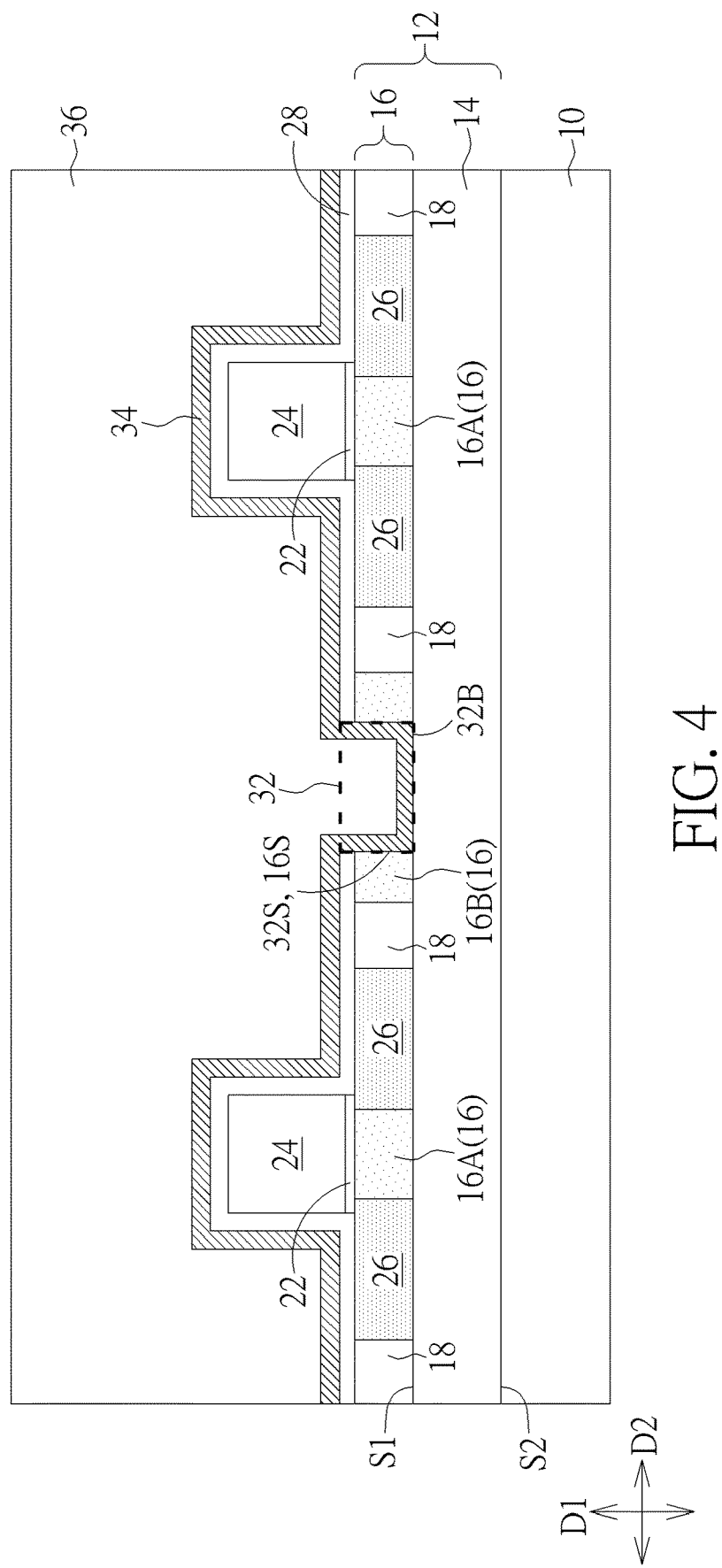
Figure 5:
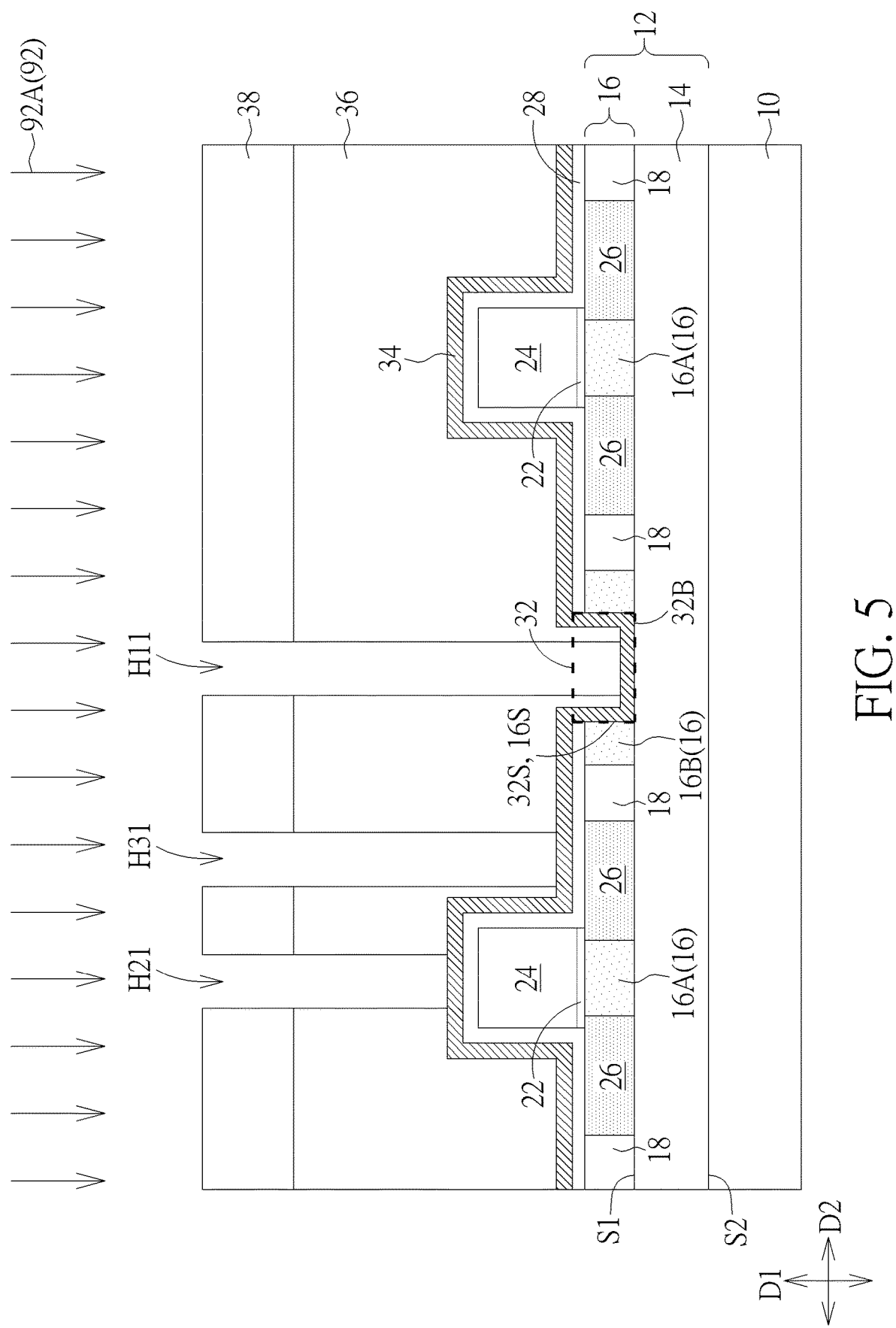
Figure 6:
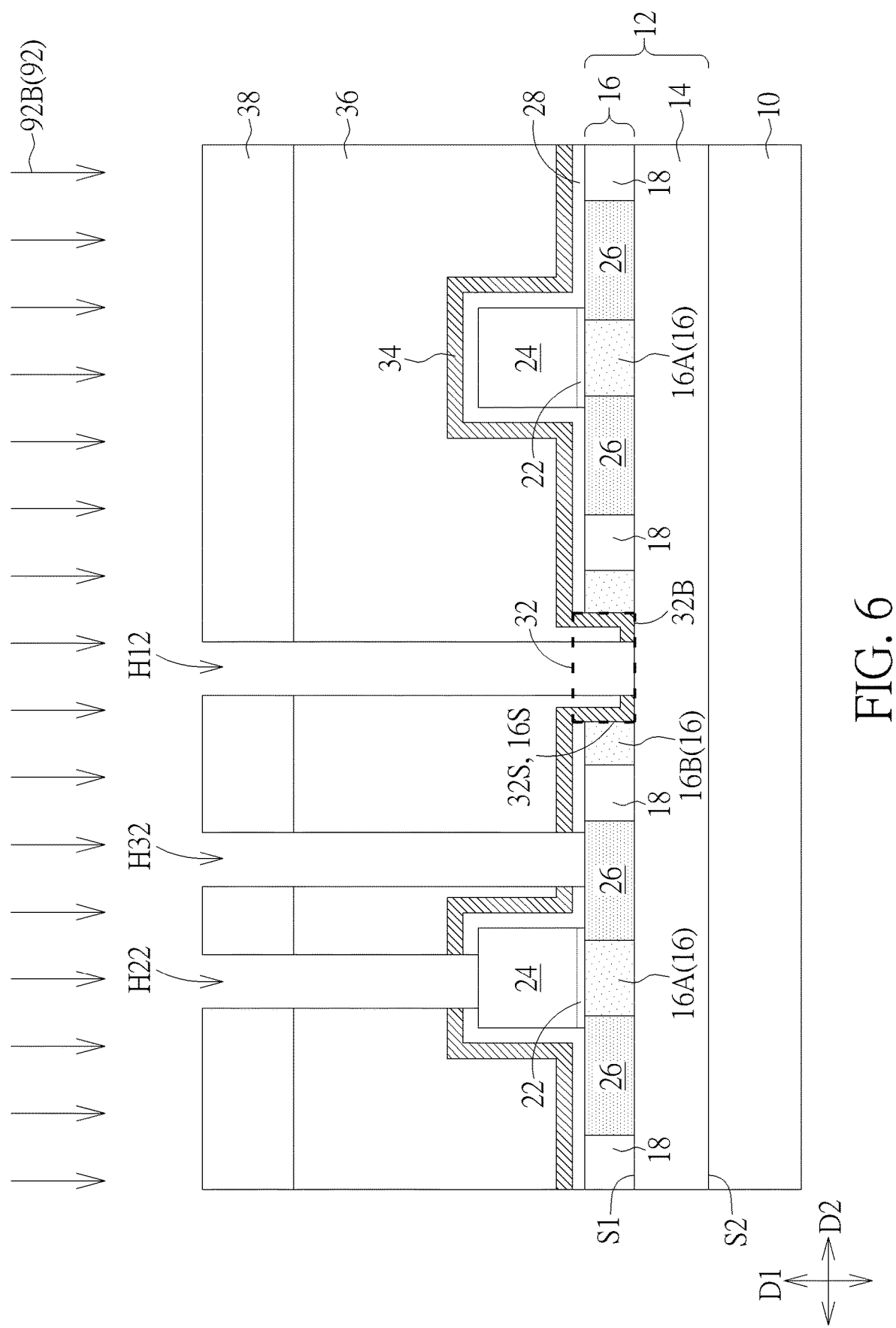
Figure 7:
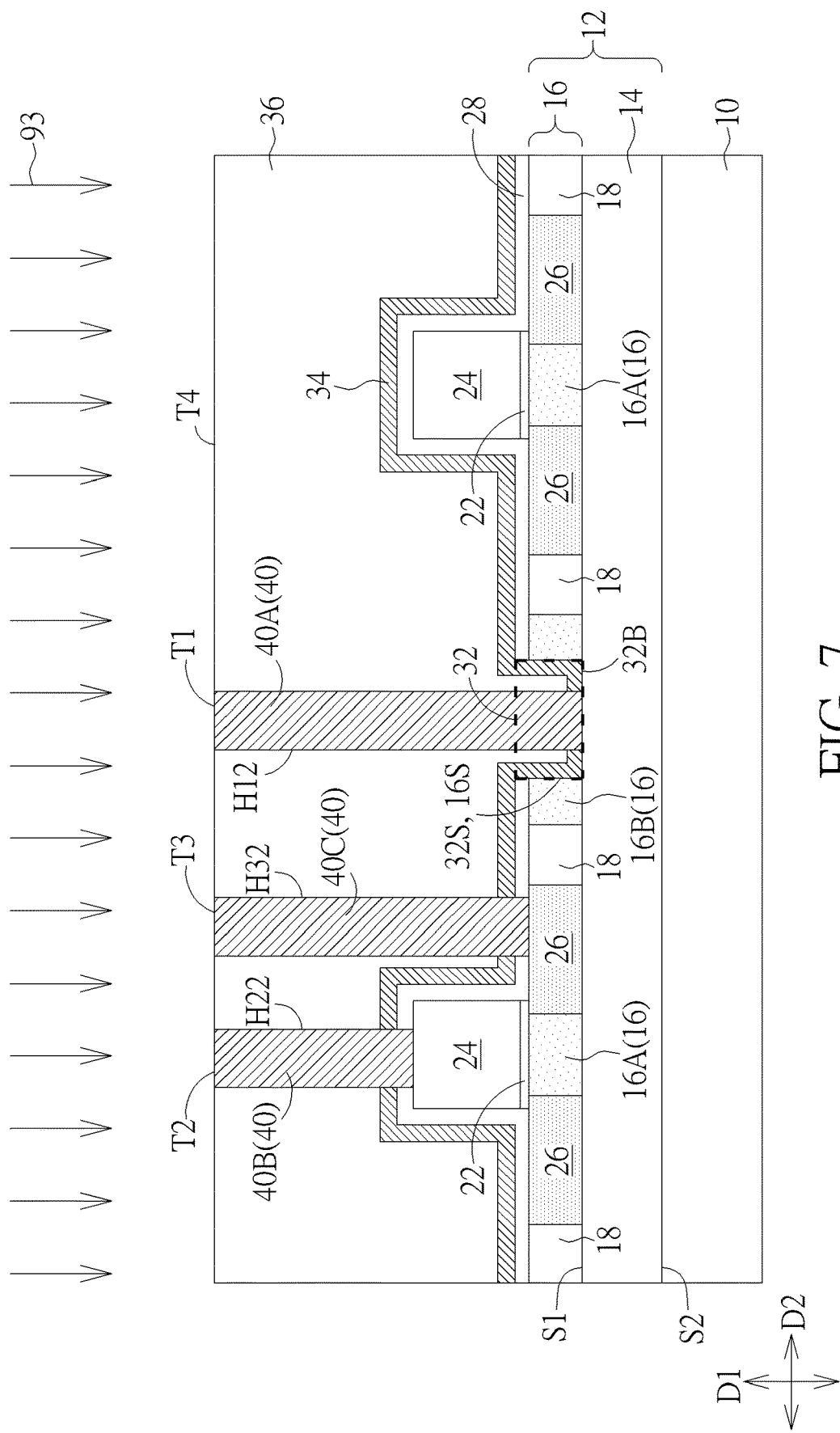
Figure 8:
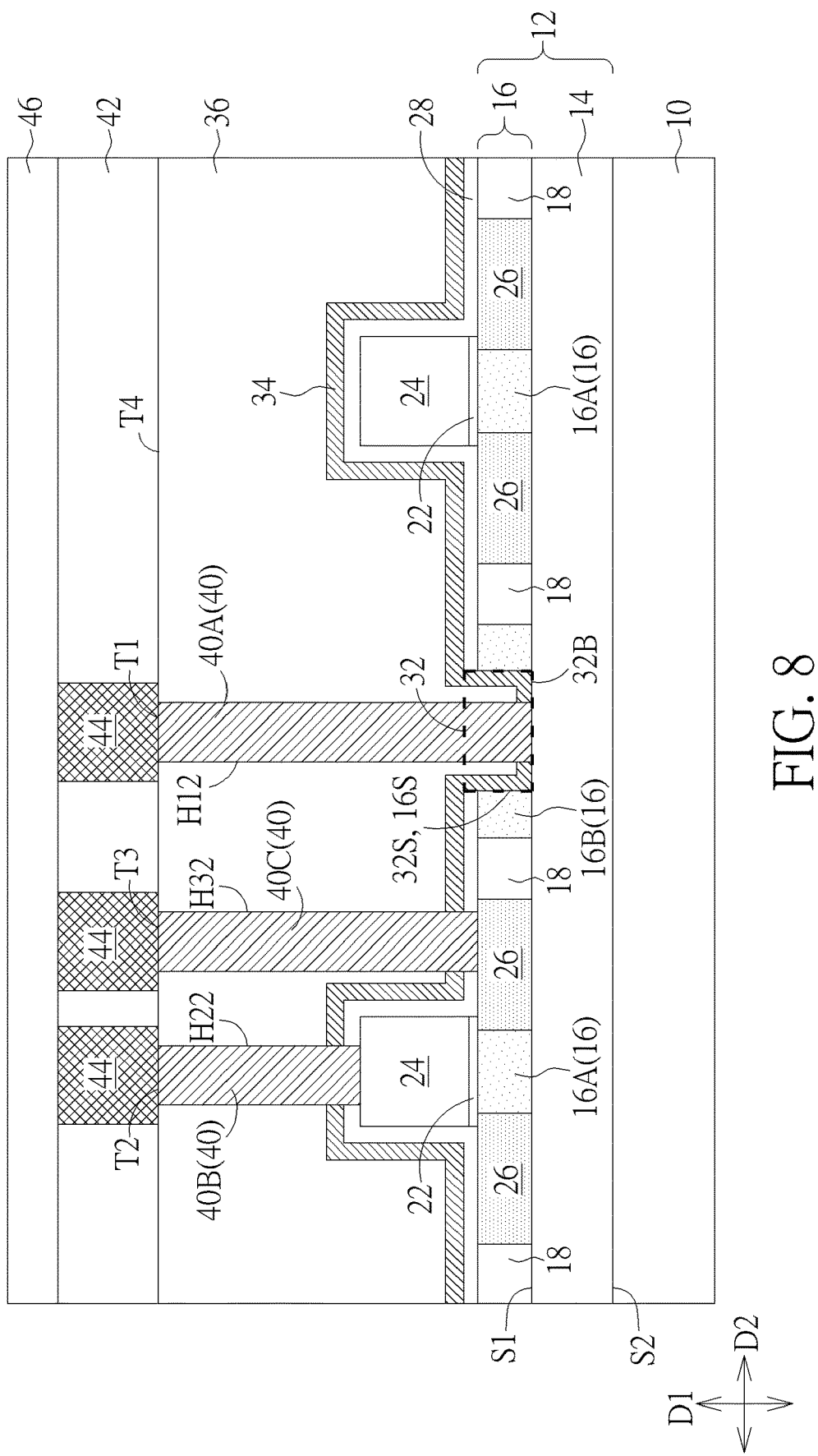
Figure 9:
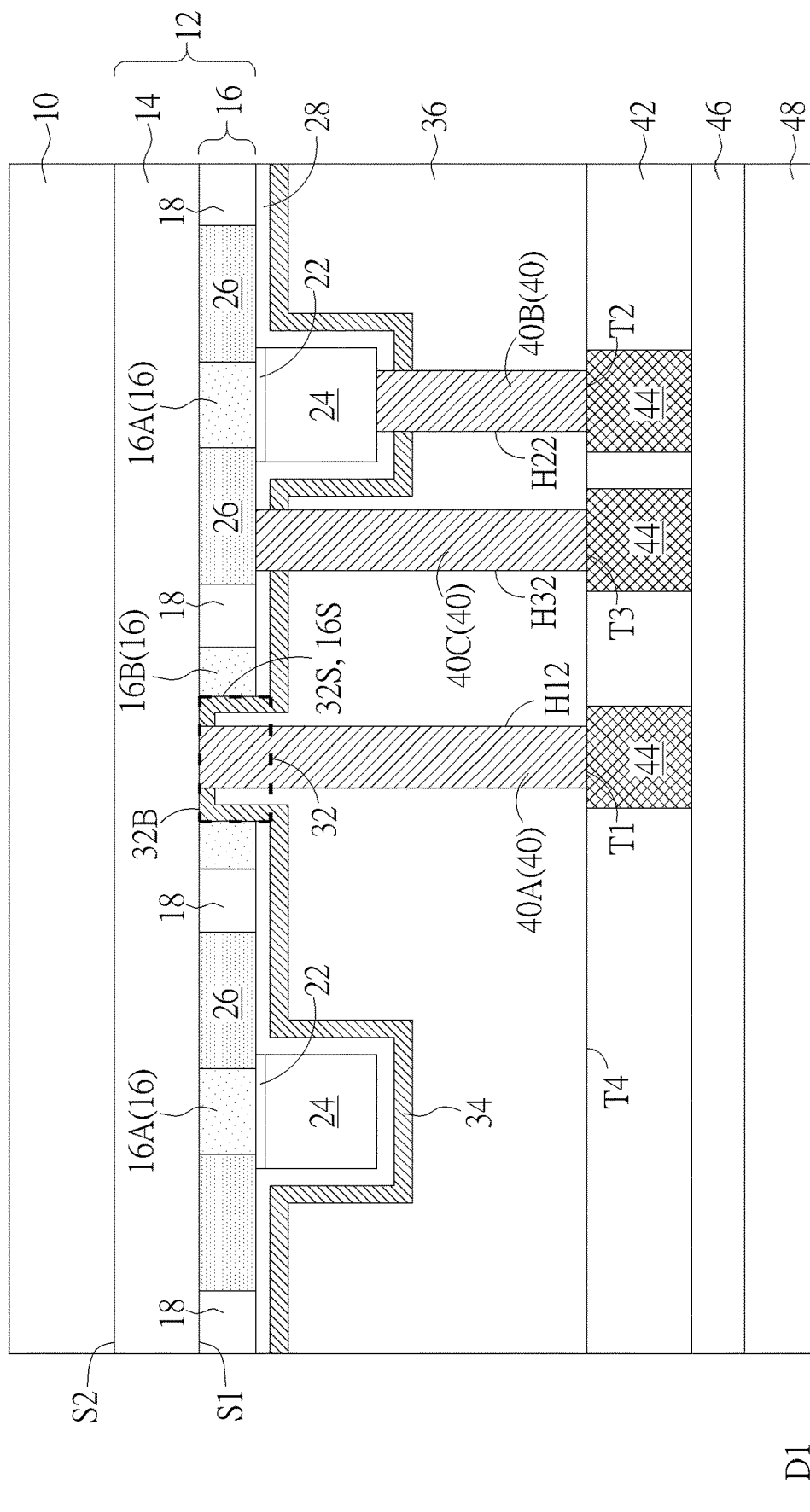
Figure 10:
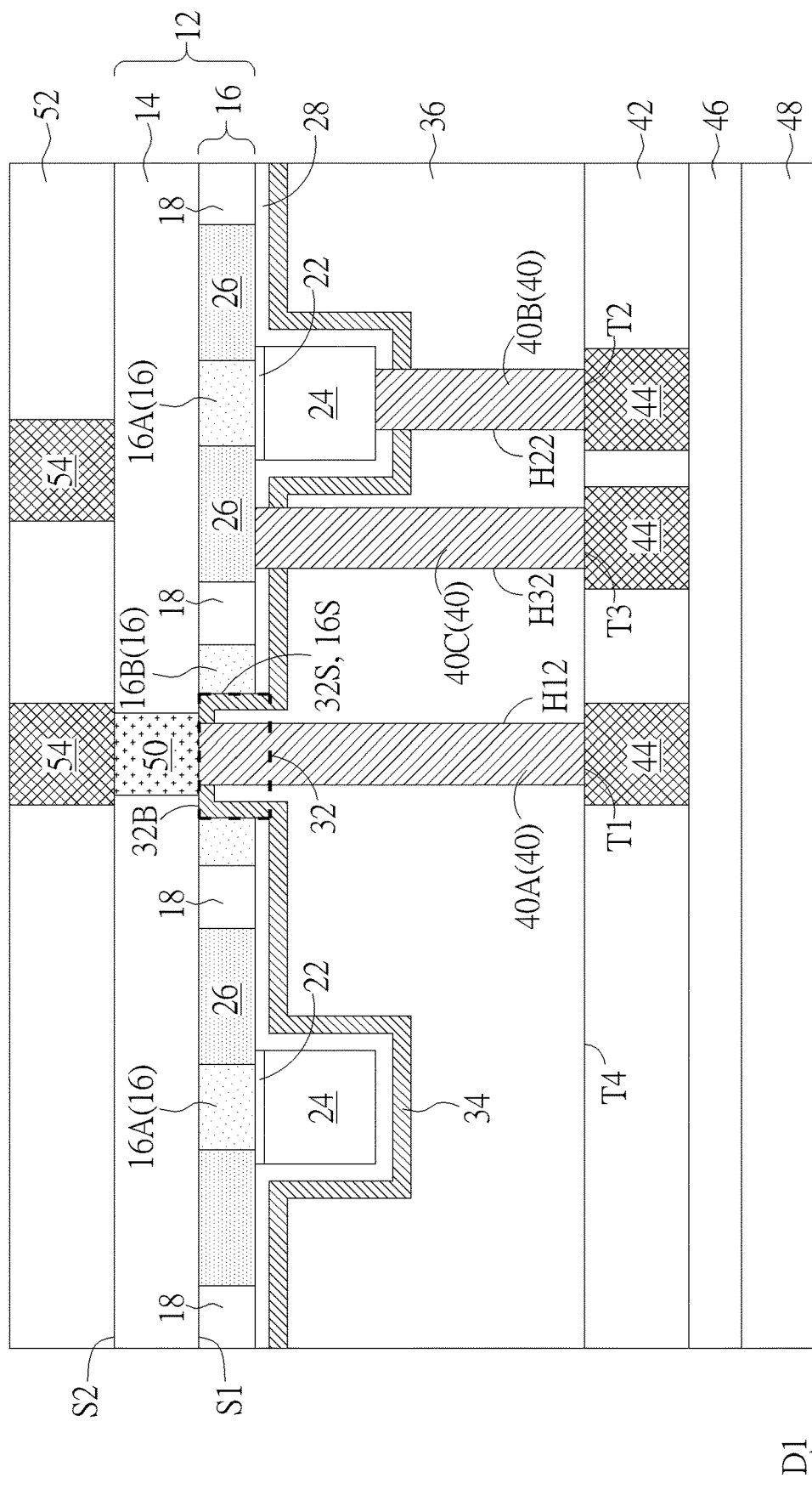

Please refer to FIGS. 1-10. FIGS. 2-10 are schematic drawings illustrating a manufacturing method of a semiconductor device according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, and FIG. 1 may be regarded as a schematic drawing in a step subsequent to FIG. 10. As shown in FIG. 1, a manufacturing method of the semiconductor device 101 in this embodiment may include the following steps. Firstly, the substrate 12 is provided. The substrate 12 includes the buried insulation layer 14, the semiconductor layer 16, and the isolation structure 18. The semiconductor layer 16 is disposed on the buried insulation layer 14, and the isolation structure 18 is disposed in the semiconductor layer 16. Subsequently, the gate structure 24 is formed on the semiconductor layer 16, and the source/drain region 26 is formed in the semiconductor layer 16. The contact opening 32 is subsequently formed. The contact opening 32 penetrates at least a part of the substrate 12, and at least a part of the contact opening 32 is formed above the buried insulation layer 14. The etching stop layer 34 is then formed on the gate structure 24, the source/drain region 26, the sidewall 32S of the contact opening 32, and the bottom 32B of the contact opening 32, and the interlayer dielectric layer 36 is formed on the etching stop layer 34. The interlayer dielectric layer 36 is partially formed in the contact opening 32. Subsequently, the first contact structure 40A is formed, and the first contact structure 40A penetrates the interlayer dielectric layer 36 in the contact opening 32 and the etching stop layer 34 in the contact opening 32.

Specifically, the manufacturing method of the semiconductor device 101 in this embodiment may include but is not limited to the following steps. As shown in FIG. 2, in some embodiments, the substrate 12 may be disposed on a first supporting substrate 10 before the steps of forming the gate dielectric layers 22, the gate structures 24, and the source/drain regions 26, and the first supporting substrate 10 may be located at the second side S2 of the buried insulation layer 14. In some embodiments, the first supporting substrate 10, the buried insulation layer 14, and the semiconductor layer 16 may be regarded as a SOI substrate, and the first supporting substrate 10 may be a substrate having low electrical resistivity (such as a silicon substrate) or a supporting substrate made of other suitable materials, but not limited thereto. Additionally, in some embodiments, the first protection layer 28 may be conformally formed on the semiconductor layer 16, the source/drain regions 26, the isolation structure 18, the gate dielectric layers 22, and the gate structures 24 after the steps of forming the gate dielectric layers 22, the gate structures 24, and the source/drain regions 26, but not limited thereto.

Subsequently, as shown in FIG. 2 and FIG. 3, the contact opening 32 is formed penetrating at least a part of the substrate 12. In some embodiments, the contact opening 32 may penetrate the first protection layer 28 and the semiconductor layer 16 (such as the second portion 16B of the semiconductor layer 16) in the first direction D1 and expose a part of the buried insulation layer 14. In this circumstance, at least a part of the contact opening 32 may be formed at the first side S1 of the buried insulation layer 14, the sidewall 32S of the contact opening 32 may include the sidewall 16S of the semiconductor layer 16 and the sidewall of the first protection layer 28, and the bottom 32B of the contact opening 32 may be a surface of the buried insulation layer 14, but not limited thereto. In some embodiments, a first patterned mask layer 30 may be formed on the first protection layer 28, and an etching process 91 using the first patterned mask layer 30 as an etching mask may be performed for removing a part of the first protection layer 28 and a part of the semiconductor layer 16 and forming the contact opening 32. In some embodiments, the etching process 91 may include an anisotropic etching process or other suitable etching approaches.

As shown in FIG. 3 and FIG. 4, after the etching process 91, the first patterned mask layer 30 may be removed, and the etching stop layer 34 and the interlayer dielectric layer 36 may be formed. In some embodiments, the etching stop layer 34 may be formed conformally on the first protection layer 28 and formed conformally on the sidewall 32S of the contact opening 32 and the bottom 32B of the contact opening 32, and the contact opening 32 is not fully filled with the etching stop layer 34. In addition, the etching stop layer 34 may directly contact the sidewall 16S of the semiconductor layer 16 and the buried insulation layer exposed by the contact opening 32, but not limited thereto.

Subsequently, as shown in FIGS. 5-7, the first contact structure 40A, the second contact structure 40B, and the third contact structure 40C described above are formed. In some embodiments, the first contact structure 40A may penetrate the etching stop layer 34 located in the contact opening 32 and the interlayer dielectric layer 36 located above this portion of the etching stop layer 34 in the first direction D1, the second contact structure 40B may penetrate the first protection layer 28, the etching stop layer 34, and the interlayer dielectric layer 36 on the gate structure 24 in the first direction D1, and the third contact structure 40C may penetrate the first protection layer 28, the etching stop layer 34, and the interlayer dielectric layer 36 on the source/drain region 26 in the first direction D1, but not limited thereto. Therefore, the first contact structure 40A may directly contact the buried insulation layer 14, the second contact structure 40B may be electrically connected with the gate structure 24, and the third contact structure 40C may be electrically connected with the source/drain region 26.

In some embodiments, the first contact structure 40A, the second contact structure 40B, and the third contact structure 40C may be formed concurrently by the same process. For example, the process of forming the process of forming the first contact structure 40A, the second contact structure 40B, and the third contact structure 40C may include but is not limited to the following steps. Firstly, as shown in FIG. 5 and FIG. 6, a second patterned mask layer 38 may be formed on the interlayer dielectric layer 36 and an etching process 92 may be performed using the second patterned mask layer 38 for concurrently forming holes corresponding to the first contact structure 40A, the second contact structure 40B, and the third contact structure 40C.

In some embodiments, the etching process 92 may include a first etching step 92A and a second etching step 92B performed after the first etching step 92A. The first etching step 92A may be configured to form a first hole H11 penetrating the interlayer dielectric layer 36 above the etching stop layer 34 formed in the contact opening 32, a second hole H21 penetrating the interlayer dielectric layer 36 above the gate structure 24, and a third hole H31 penetrating the interlayer dielectric layer 36 above the source/drain region 26, and the first etching step 92A may stop at the etching stop layer 34. The etching selectivity between the etching stop layer 34 and the interlayer dielectric layer 36 in the first etching step 92A may be increased by controlling the material compositions of the etching stop layer 34 and the interlayer dielectric layer 36 and using the suitable etching approach, and the first etching step 92A may stop at the etching stop layer 34 accordingly. Therefore, the first hole H11, the second hole H21, and the third hole H31 may expose a part of the etching stop layer 34 respectively, and the first hole H11, the second hole H21, and the third hole H31 may not penetrate the etching stop layer 34.

Subsequently, the second etching step 92B may be performed. The second etching step 92B may be configured to remove the etching stop layer 34 exposed by the first hole H11, the second hole H21, and the third hole H31 respectively and form a fourth hole H12, a fifth hole H22, and a sixth hole H32 respectively. In some embodiments, the second etching step 92B may be configured to further remove the first protection layer 28 overlapping the second hole H21 in the first direction D1 and the first protection layer 28 overlapping the third hole H31 in the first direction D1. Therefore, the fifth hole H22 may penetrate the first protection layer 28, the etching stop layer 34, and the interlayer dielectric layer 36 above the gate structure 24 in the first direction D1, the sixth hole H32 may penetrate the first protection layer 28, the etching stop layer 34, and the interlayer dielectric layer 36 above the source/drain region 26 in the first direction D1, and the fourth hole H12 may penetrate the interlayer dielectric layer 36 and the etching stop layer 34 in the contact opening 32.

As shown in FIG. 6 and FIG. 7, a conductive material 40 may be formed in the fourth hole H12, the fifth hole H22, and the sixth hole H32, and a planarization process 93 may be performed to the conductive material 40 and the interlayer dielectric layer 36 for forming the first contact structure 40A in the fourth hole H12, forming the second contact structure 40B in the fifth hole H22, and forming the third contact structure 40C in the sixth hole H32. In some embodiments, the conductive material 40 may include a low electrical resistivity material (such as copper, aluminum, and tungsten) and a barrier layer (such as titanium nitride, tantalum nitride, or other suitable electrically conductive barrier materials) surrounding this low electrical resistivity material, but not limited thereto. The planarization process 93 described above may include a chemical mechanical polishing (CMP) process, an etching back process, or other suitable planarization approaches. The first contact structure 40A, the second contact structure 40B, and the third contact structure 40C, which have to be formed separately by different steps originally, may be formed concurrently by the same process because the contact opening 32 is formed in the substrate 12 first and the etching stop layer 34 is formed in the contact opening 32 and formed on the semiconductor unit. The purposes of process simplification (such as reducing required times of film-forming processes and/or planarization processes) and related manufacturing issue (such as related defects generated by performing CMP processes to the contact structures) improvement may be achieved accordingly. Additionally, after the planarization process 93, a top surface T1 of the first contact structure 40A, a top surface T2 of the second contact structure 40B, a top surface T3 of the third contact structure 40C, and a top surface T4 of the interlayer dielectric layer 36 may be substantially coplanar, but not limited thereto.

Subsequently, as shown in FIG. 8, the dielectric layer 42, the interconnection structure 44, and the second protection layer 46 may be formed on the interlayer dielectric layer 36, and the interconnection structure 44 may be electrically connected with the first contact structure 40A, the second contact structure 40B, and the third contact structure 40C. As shown in FIG. 8 and FIG. 9, after the second protection layer 46 is formed, the first supporting substrate 10 may be turned over and a second supporting substrate 48 may be connected to a side of the second protection layer 46 opposite to the semiconductor layer 16. In some embodiments, the second supporting substrate 48 may include a silicon substrate having high electrical resistance, a glass substrate, a plastic substrate, a sapphire substrate, or other suitable types of insulation substrates, but not limited thereto. As shown in FIG. 9 and FIG. 10, the first supporting substrate 10 may be removed, the connection structure 50 may be formed in the buried insulation layer 14, and the dielectric layer 52 and the conductive structure 54 may be formed on the buried insulation layer 14 subsequently. The dielectric layer 52 and the conductive structure 54 may be formed at the second side S2 of the buried insulation layer 14, and the first contact structure 40A may be electrically connected with the conductive structure 54 via the connection structure 50. As shown in FIG. 10 and FIG. 1, in some embodiments, the second supporting substrate 48 may be removed after the step of forming the conductive structure 54 according to some design considerations, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 11:
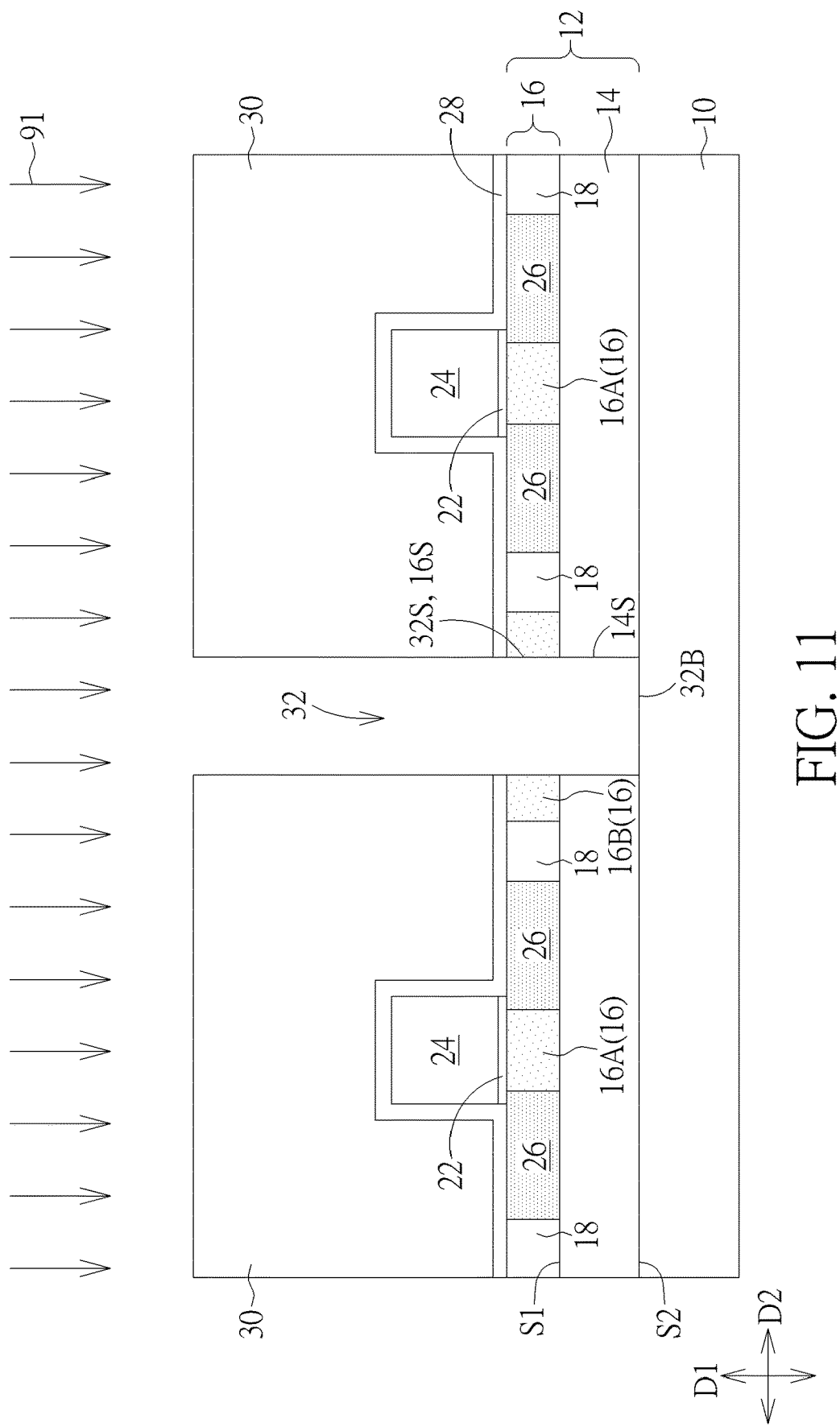
Figure 12:
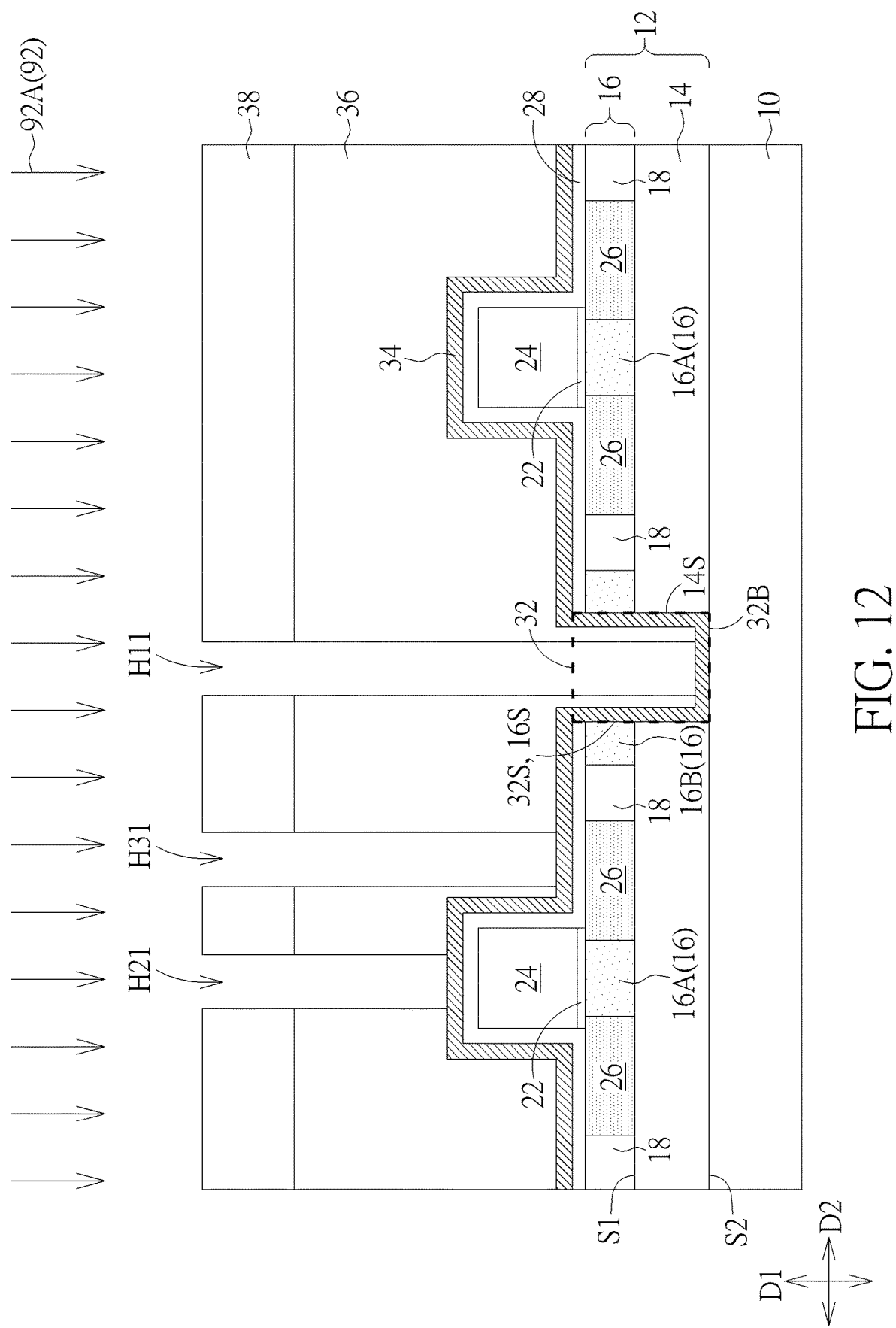
Figure 13:
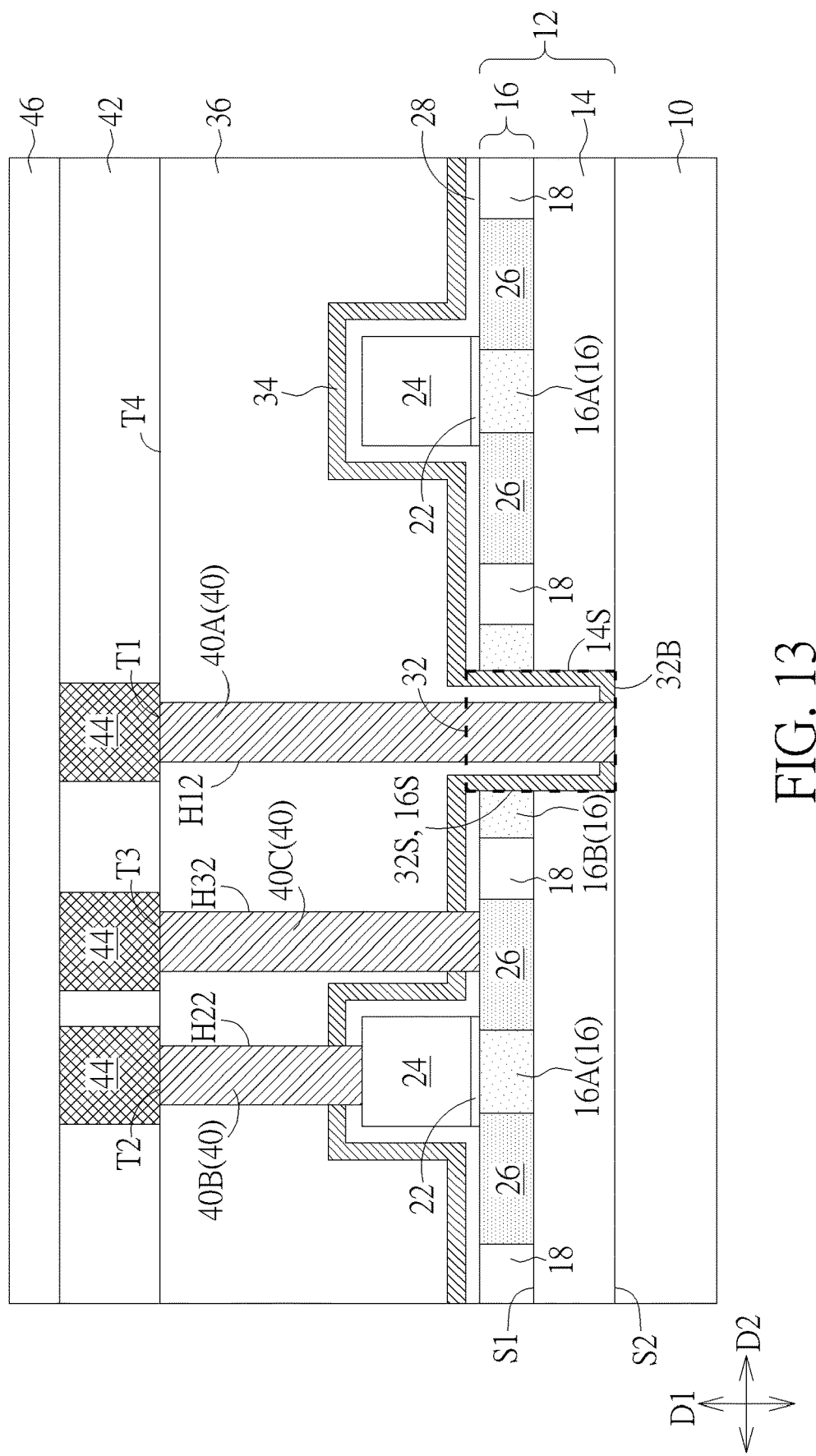
Figure 14:
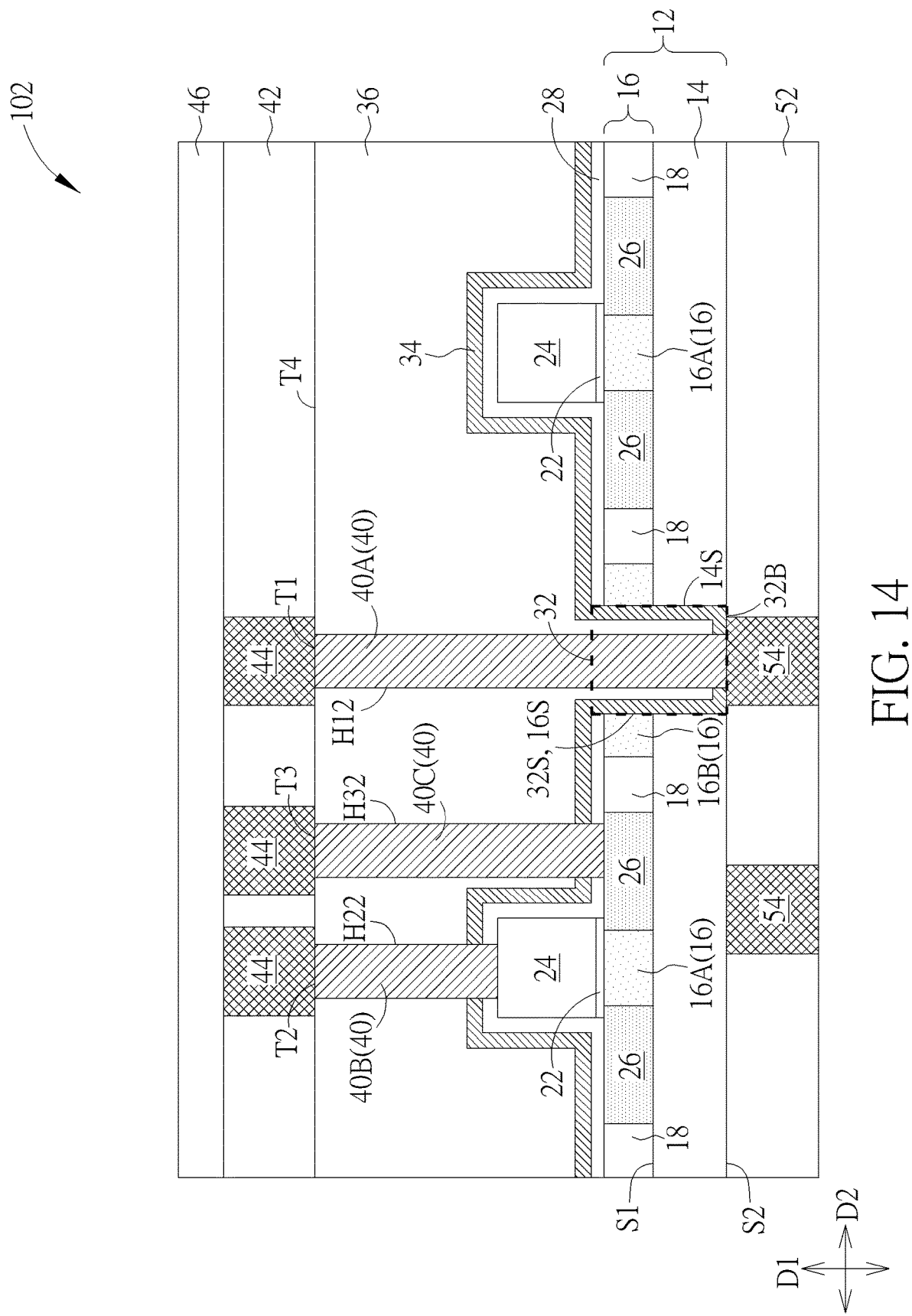

Please refer to FIGS. 11-14. FIGS. 11-14 are schematic drawings illustrating a manufacturing method of a semiconductor device 102 according to a second embodiment of the present invention, wherein FIG. 12 is a schematic drawing in a step subsequent to FIG. 11, FIG. 13 is a schematic drawing in a step subsequent to FIG. 12, and FIG. 14 is a schematic drawing in a step subsequent to FIG. 13. As shown in FIG. 11, in some embodiments, the contact opening 32 may penetrate the first protection layer 28, the semiconductor layer 16 (such as the second portion 16B of the semiconductor layer 16), and the buried insulation layer 14 in the first direction D1 and expose a part of the first supporting substrate 10. In this circumstance, the sidewall 32S of the contact opening 32 may include a sidewall 14S of the buried insulation layer 14, the sidewall 16S of the semiconductor layer 16, and a sidewall of the first protection layer 28, and the bottom 32B of the contact opening 32 may be a surface of the first supporting substrate 10, but not limited thereto. As shown in FIG. 11 and FIG. 12, after the etching process 91, the first patterned mask layer 30 may be removed, and the etching stop layer 34 and the interlayer dielectric layer 36 may be formed. In some embodiments, the etching stop layer 34 may be formed conformally on the first protection layer 28 and formed conformally on the sidewall 32S of contact opening 32 and the bottom 32B of the contact opening 32, and the etching stop layer 34 may directly contact the sidewall 16S of the semiconductor layer 16, the sidewall 14S of the buried insulation layer 14, and the first supporting substrate 10 exposed by the contact opening 32, but not limited thereto.

Subsequently, as shown in FIG. 12 and FIG. 13, the first contact structure 40A, the second contact structure 40B, the third contact structure 40C, the dielectric layer 42, the interconnection structure 44, and the second protection layer 46 described above may be formed. In some embodiments, the first contact structure 40A may penetrate the etching stop layer 34 in the contact opening 32 and directly contact the first supporting layer 10, but not limited thereto. As shown in FIG. 14, the dielectric layer 52 and the conductive structure 54 may then be formed at the second side S2 of the buried insulation layer 14, and the conductive structure 54 may be electrically connected with the first contact structure 40A accordingly. In some embodiments, the conductive structure 54 may directly contact the first contact structure 40A for being electrically connected with the first contact structure 40A because the contact opening 32 may penetrate the buried insulation layer 14, but not limited thereto.

Figure 15:
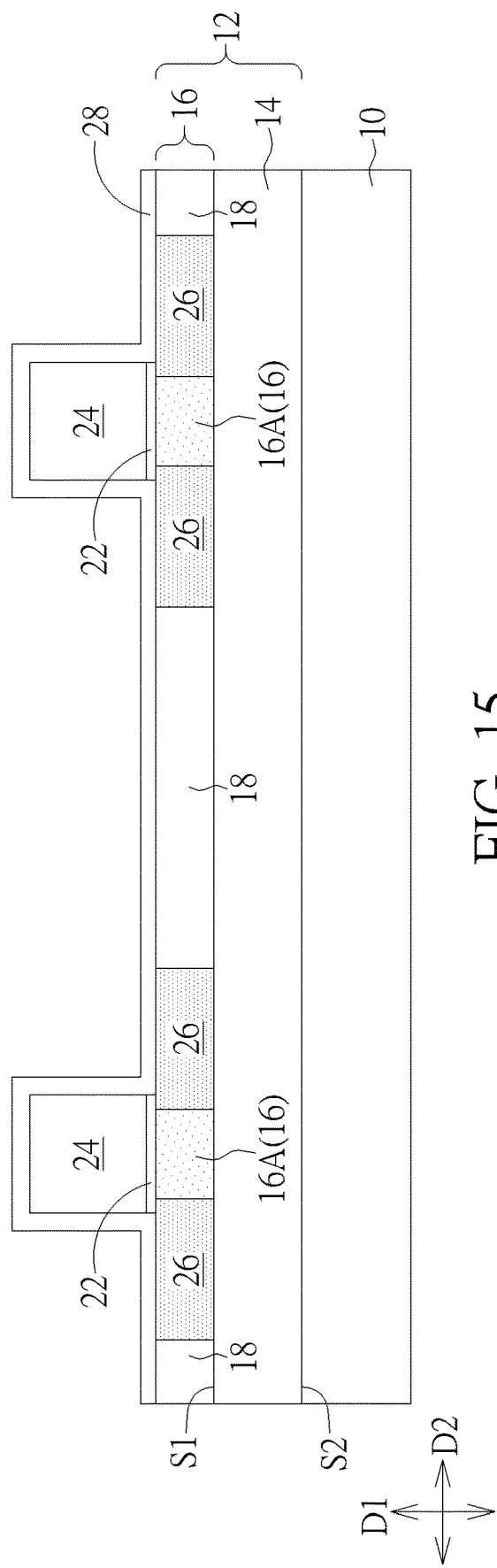
Figure 16:
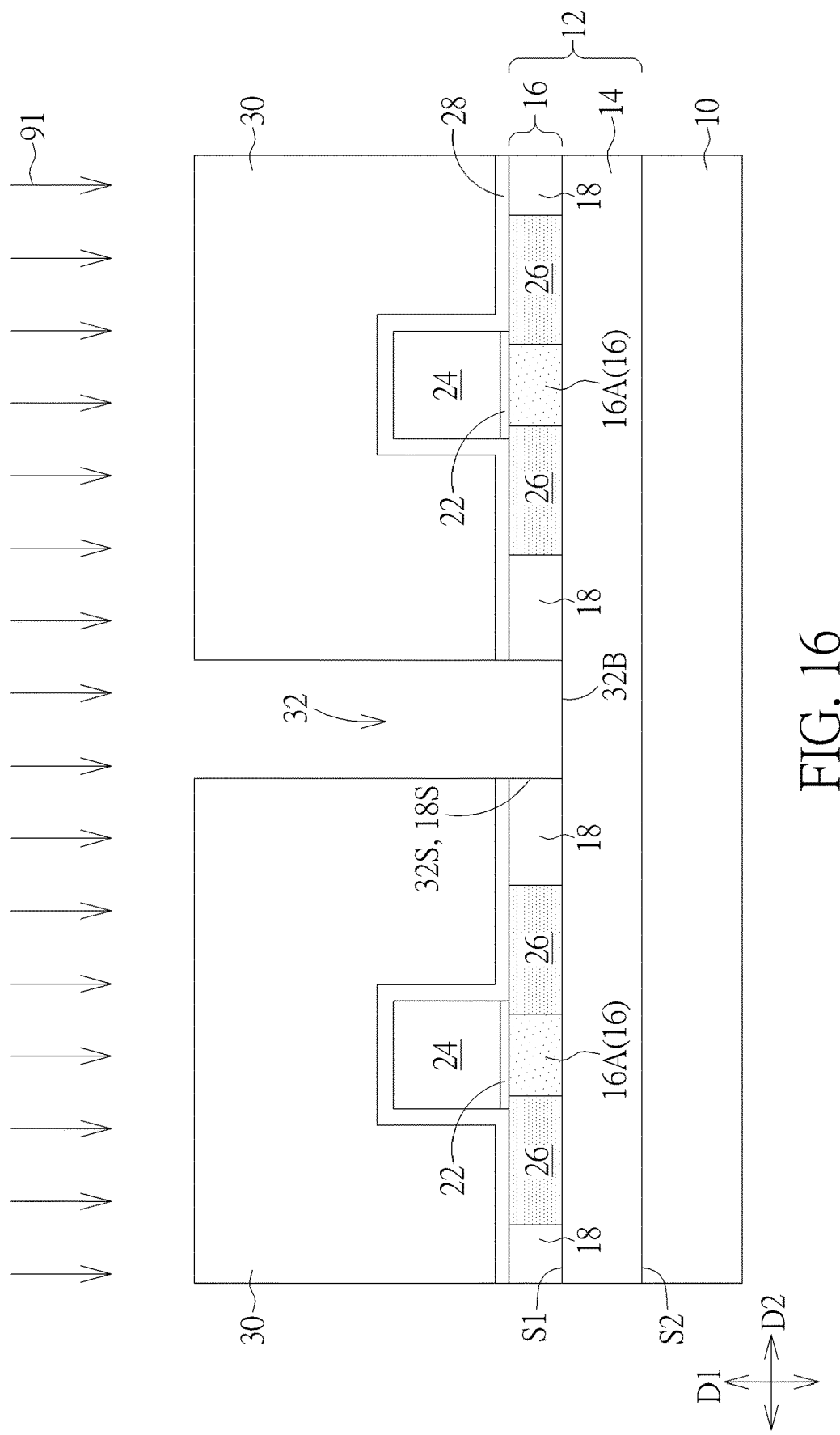
Figure 17:
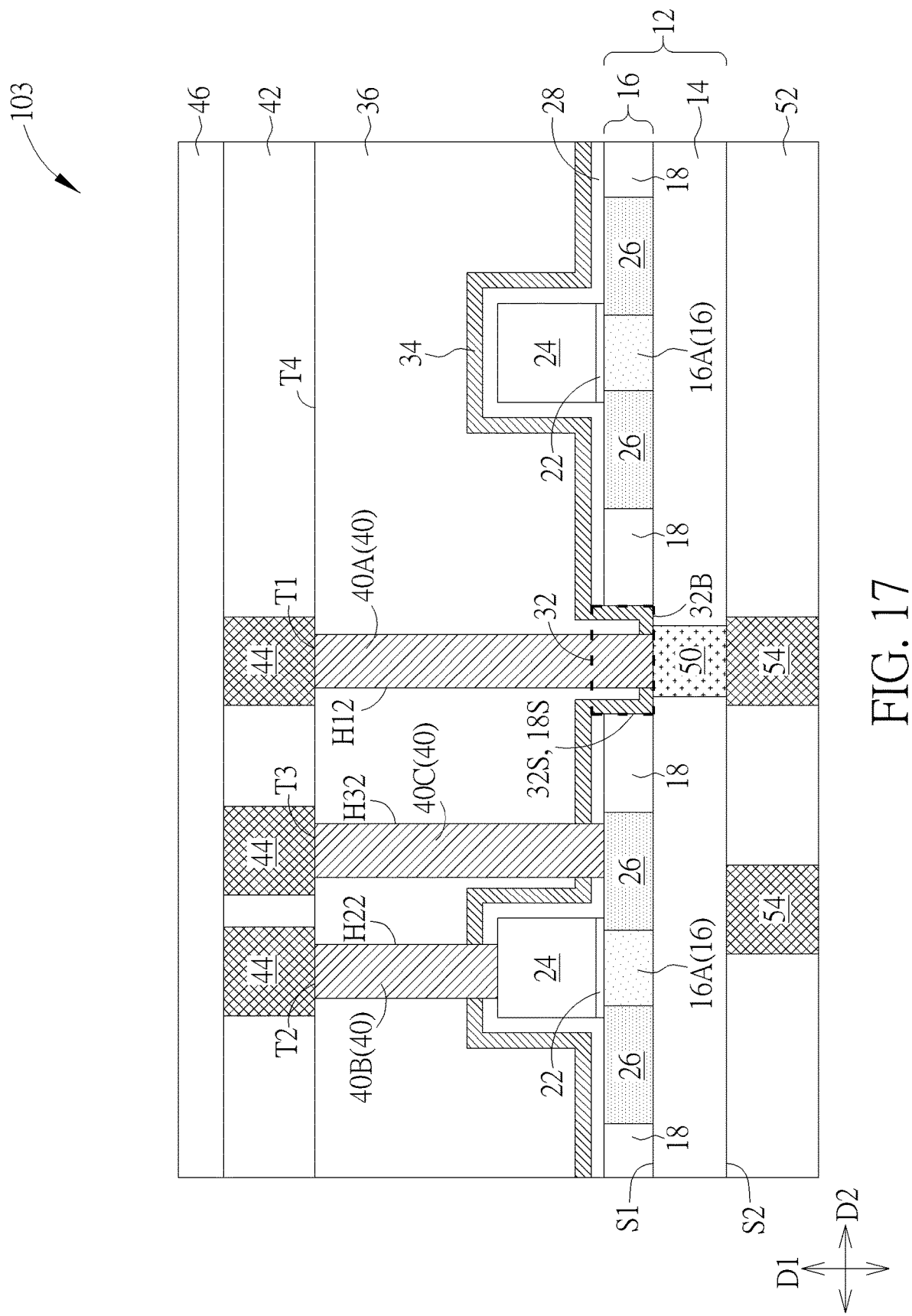

Please refer to FIGS. 15-17. FIGS. 15-17 are schematic drawings illustrating a manufacturing method of a semiconductor device 103 according to a third embodiment of the present invention, wherein FIG. 16 is a schematic drawing in a step subsequent to FIG. 15, and FIG. 17 is a schematic drawing in a step subsequent to FIG. 16. As shown in FIG. 15 and FIG. 16, in some embodiments, the contact opening 32 may penetrate the first protection layer 28 and the isolation structure 18 in the first direction D1 and expose a part of the buried insulation layer 14. In this circumstance, the sidewall 32S of the contact opening 32 may include a sidewall 18S of the isolation structure 18 and the sidewall of the first protection layer 28, and the bottom 32B of the contact opening 32 may be a surface of the buried insulation layer 14, but not limited thereto. In some embodiments, the contact opening 32 may penetrate the first protection layer 28, the isolation structure 18, and the buried insulation layer 14 and expose a part of the first supporting substrate 10. Subsequently, as shown in FIG. 17, the etching stop layer 34, the interlayer dielectric layer 36, the first contact structure 40A, the second contact structure 40B, the third contact structure 40C, the dielectric layer 42, the interconnection structure 44, the second protection layer 46, the connection structure 50, the dielectric layer 52, and the conductive structure 54 described above may be formed. In the semiconductor device 103, the etching stop layer 34 disposed in the contact opening 32 may directly contact the sidewall 18S of the isolation structure 18, but not limited thereto.

To summarize the above descriptions, according to the semiconductor device and the manufacturing method thereof in the present invention, the contact structure corresponding to the back side connection structure and the contact structure corresponding to the semiconductor unit may be formed concurrently by the same process because the contact opening corresponding to the back side connection structure is formed in the substrate first and the etching stop layer is formed in the contact opening and formed on the semiconductor unit. The purposes of process simplification and manufacturing yield enhancement may be achieved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a substrate, comprising:
        a buried insulation layer;
        a semiconductor layer disposed on the buried insulation layer; and
        an isolation structure disposed in the semiconductor layer;
    a gate structure disposed on the semiconductor layer;
    a source/drain region disposed in the semiconductor layer;
    a contact opening penetrating at least a part of the substrate, wherein at least a part of the contact opening is disposed above the buried insulation layer;
    an etching stop layer disposed on the gate structure, the source/drain region, a sidewall of the contact opening, and a bottom of the contact opening;
    an interlayer dielectric layer disposed on the etching stop layer, wherein the interlayer dielectric layer is partially disposed in the contact opening; and
    a first contact structure penetrating the interlayer dielectric layer in the contact opening and the etching stop layer in the contact opening.

2. The semiconductor device according to claim 1, further comprising:
    a conductive structure disposed on the buried insulation layer, wherein the buried insulation layer has a first side and a second side opposite to the first side in a thickness direction of the buried insulation layer, at least a part of the contact opening is disposed at the first side of the buried insulation layer, the conductive structure is disposed at the second side of the buried insulation layer, and the first contact structure is electrically connected with the conductive structure.

3. The semiconductor device according to claim 1, wherein the contact opening penetrates the semiconductor layer of the substrate in a thickness direction of the buried insulation layer.

4. The semiconductor device according to claim 3, wherein the etching stop layer disposed in the contact opening directly contacts a sidewall of the semiconductor layer.

5. The semiconductor device according to claim 1, wherein the contact opening penetrates the semiconductor layer and the buried insulation layer of the substrate in a thickness direction of the buried insulation layer.

6. The semiconductor device according to claim 5, wherein the etching stop layer disposed in the contact opening directly contacts a sidewall of the semiconductor layer and a sidewall of the buried insulation layer.

7. The semiconductor device according to claim 1, wherein the contact opening penetrates the isolation structure in a thickness direction of the buried insulation layer.

8. The semiconductor device according to claim 7, wherein the etching stop layer disposed in the contact opening directly contacts a sidewall of the isolation structure.

9. The semiconductor device according to claim 1, further comprising:
    a second contact structure penetrating the interlayer dielectric layer and the etching stop layer on the gate structure and electrically connected with the gate structure; and
    a third contact structure penetrating the interlayer dielectric layer and the etching stop layer on the source/drain region and electrically connected with the source/drain region, wherein a top surface of the first contact structure, a top surface of the second contact structure, and a top surface of the third contact structure are coplanar.

10. The semiconductor device according to claim 9, further comprising:
    an interconnection structure disposed on the interlayer dielectric layer, wherein the interconnection structure is electrically connected with the first contact structure, the second contact structure, and the third contact structure.

11. A manufacturing method of a semiconductor device, comprising:
 providing a substrate, the substrate comprising:
  a buried insulation layer;
  a semiconductor layer disposed on the buried insulation layer; and
  an isolation structure disposed in the semiconductor layer;
 forming a gate structure on the semiconductor layer;
 forming a source/drain region in the semiconductor layer;
 forming a contact opening penetrating at least a part of the substrate, wherein at least a part of the contact opening is formed above the buried insulation layer;
 forming an etching stop layer on the gate structure, the source/drain region, a sidewall of the contact opening, and a bottom of the contact opening;
 forming an interlayer dielectric layer on the etching stop layer, wherein the interlayer dielectric layer is partially formed in the contact opening; and
 forming a first contact structure penetrating the interlayer dielectric layer in the contact opening and the etching stop layer in the contact opening.

12. The manufacturing method of the semiconductor device according to claim 11, wherein the contact opening penetrates the semiconductor layer of the substrate in a thickness direction of the buried insulation layer.

13. The manufacturing method of the semiconductor device according to claim 11, wherein the contact opening penetrates the semiconductor layer and the buried insulation layer of the substrate in a thickness direction of the buried insulation layer.

14. The manufacturing method of the semiconductor device according to claim 11, wherein the contact opening penetrates the isolation structure in a thickness direction of the buried insulation layer.

15. The manufacturing method of the semiconductor device according to claim 11, further comprising:
 forming a second contact structure penetrating the interlayer dielectric layer and the etching stop layer on the gate structure, wherein the second contact structure is electrically connected with the gate structure; and
 forming a third contact structure penetrating the interlayer dielectric layer and the etching stop layer on the source/drain region, wherein the third contact structure is electrically connected with the source/drain region, and the first contact structure, the second contact structure, and the third contact structure are formed concurrently by a process.

16. The manufacturing method of the semiconductor device according to claim 15, wherein the process of forming the first contact structure, the second contact structure, and the third contact structure comprises:
 performing a first etching step for forming a first hole penetrating the interlayer dielectric layer above the etching stop layer formed in the contact opening, a second hole penetrating the interlayer dielectric layer above the gate structure, and a third hole penetrating the interlayer dielectric layer above the source/drain region, wherein the first etching step stops at the etching stop layer, and the first hole, the second hole, and the third hole expose a part of the etching stop layer respectively;
 performing a second etching step after the first etching step, wherein the second etching step is configured to:
  remove the etching stop layer exposed by the first hole and form a fourth hole penetrating the interlayer dielectric layer and the etching stop layer in the contact opening;
  remove the etching stop layer exposed by the second hole and form a fifth hole penetrating the interlayer dielectric layer and the etching stop layer above the gate structure; and
  remove the etching stop layer exposed by the third hole and form a sixth hole penetrating the interlayer dielectric layer and the etching stop layer above the source/drain region; and
 forming a conductive material in the fourth hole, the fifth hole, and the sixth hole.

17. The manufacturing method of the semiconductor device according to claim 16, wherein the process of forming the first contact structure, the second contact structure, and the third contact structure further comprises:
 performing a planarization process to the conductive material for forming the first contact structure in the fourth hole, forming the second contact structure in the fifth hole, and forming the third contact structure in the sixth hole.

18. The manufacturing method of the semiconductor device according to claim 15, further comprising:
 forming an interconnection structure on the interlayer dielectric layer, wherein the interconnection structure is electrically connected with the first contact structure, the second contact structure, and the third contact structure.

19. The manufacturing method of the semiconductor device according to claim 11, further comprising:
 forming a conductive structure on the buried insulation layer, wherein the buried insulation layer has a first side and a second side opposite to the first side in a thickness direction of the buried insulation layer, at least a part of the contact opening is formed at the first side of the buried insulation layer, the conductive structure is formed at the second side of the buried insulation layer, and the first contact structure is electrically connected with the conductive structure.

20. The manufacturing method of the semiconductor device according to claim 19, further comprising:
 forming a connection structure in the buried insulation layer, wherein the first contact structure is electrically connected with the conductive structure via the connection structure.

* * * * *